(12) United States Patent
Kaneko et al.

(10) Patent No.: US 7,511,554 B2
(45) Date of Patent: Mar. 31, 2009

(54) SYSTEMS AND METHODS FOR LEVEL SHIFTING USING AC COUPLING

(75) Inventors: Masaaki Kaneko, Round Rock, TX (US); David W. Boerstler, Round Rock, TX (US); Eskinder Hailu, Sunnyvale, CA (US); Jieming Qi, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/764,262

(22) Filed: Jun. 18, 2007

(65) Prior Publication Data

US 2008/0309395 A1  Dec. 18, 2008

(51) Int. Cl.
  *H03L 5/00* (2006.01)
(52) U.S. Cl. .............................. 327/333; 326/63; 326/80
(58) Field of Classification Search ............. 326/62–63, 326/80–83; 327/306, 33, 333
See application file for complete search history.

(56) References Cited

U.S. PATENT DOCUMENTS

| 6,147,540 | A | * | 11/2000 | Coddington | ................. 327/333 |
| 6,825,693 | B2 | * | 11/2004 | Schoenborn et al. | ........... 326/86 |
| 6,856,169 | B2 | * | 2/2005 | Frans et al. | .................... 326/82 |

* cited by examiner

*Primary Examiner*—Dinh T. Le
(74) *Attorney, Agent, or Firm*—Law Offices of Mark L. Berrier

(57) ABSTRACT

Systems and methods for conveying signals between integrated circuit (IC) components in domains having different supply voltages. AC coupling is used to increase the speed at which the common mode voltage of a signal is shifted from one level to another. One embodiment comprises a method for level shifting a binary signal in an IC. This method includes receiving an input binary signal and decoupling its AC component from its common mode component. A second common mode component is added to the AC component, providing a binary output signal. The common mode voltage of the input signal may be greater (or smaller) than that of the output signal. In one embodiment of the method, duty cycle compensation (DCC) is performed. The DCC drives the duty cycle toward a desired value.

11 Claims, 9 Drawing Sheets

SYSTEMS AND METHODS FOR LEVEL SHIFTING USING AC COUPLING

BACKGROUND

1. Field of the Invention

The invention relates generally to integrated circuits (IC) and more particularly to systems and methods for shifting the common mode voltage of a signal passing from one power domain in the IC to another.

2. Related Art

As digital devices (e.g., integrated circuits) have become more complex, and operate at ever increasing speeds. The complexity of the devices has been manifested in many ways, including the implementation of designs incorporating regions of circuitry that have different power requirements. For example, some circuits combine analog and digital components, where the analog circuits typically operate at a higher voltage than the digital circuits.

There is often a need to transfer data between domains. When transferring data or signals between domains, the signals have to be adjusted so that they have the appropriate characteristics for the destination domain. The distribution of clock signals is one such example. Signals such as clock signals must be passed between the components of different power domains, and must therefore cross the boundaries of the different domains. The signals may therefore need to be modified to suit the destination domain.

When translating a signal from a domain which uses a first supply voltage to a domain that has a different supply voltage, it is typically necessary to shift the common mode voltage of the signal from the level of the originating domain to that of the destination domain. This is commonly referred to as level shifting. There are conventional schemes for performing level shifting, but the devices that are typically used to implement these schemes are not suitable for performing this task at the frequencies required of contemporary systems.

It would therefore be desirable to provide systems and methods for level shifting that do not suffer from conventional devices' inability to operate at higher frequencies.

SUMMARY OF THE INVENTION

The various embodiments of the invention comprise systems and methods for conveying signals between integrated circuit (IC) components in domains having different supply voltages, where AC coupling is used to increase the speed at which the common mode voltage of a signal is shifted from one level to another. Some embodiments include duty cycle compensation (DCC).

One embodiment comprises a method for level shifting a binary signal in an IC. This method includes receiving an input binary signal and decoupling its AC component from its common mode component. A second common mode component is added to the AC component, providing a binary output signal. The common mode voltage of the input signal may be greater (or less) than that of the output signal.

In one embodiment of the method, duty cycle compensation (DCC) is performed. The DCC may drive the duty cycle toward a desired value. Another embodiment alternately operates in two modes, one in which DCC is performed, and another in which DCC is not performed. In yet another embodiment, the DCC mode is enabled/selected when the duty cycle of the input binary signal is outside an acceptable range.

An alternative embodiment comprises a level shifter configured to decouple the AC and DC components of a binary input signal. The AC component is then coupled to a new DC component, thereby producing a level-shifted binary output signal. The level shifter may use a capacitor to pass the AC component of the binary input signal to an intermediate node. The intermediate node may be held at a desired voltage, for example, by a voltage divider. This voltage serves as the new DC component of the signal. In one embodiment, the voltage divider is constructed with two resistors connected in series between a supply voltage and ground, with the intermediate node located between the two resistors.

In one embodiment, the level shifter also includes duty cycle compensation (DCC) circuitry that modifies the duty cycle. For example, the duty cycle can be modified to better match a desired value. The DCC circuitry may be implemented with two branches of like construction coupled to the inputs of a differential amplifier, where each branch includes an inverter, a capacitor and a voltage divider. Each inverter is coupled to a first resistor which is coupled to a supply voltage and another resistor which is coupled to ground. One branch receives the input signal and the other receives the inverted input signal. The differential amplifier may be coupled to an additional downstream amplifier to provide the binary output signal.

In one embodiment, switching circuitry is included to selectively enable and disable the DCC. This may be done using transistors to shunt around the resistors which are connected to the inverters of each of the two branches. The switching circuitry may be coupled to or include a DCC decision unit that evaluates some metric and dispatches control signals to the transistors to switch the transistors on and off. The metric may be a comparison of a duty cycle (such as of the input signal, output signal, or intermediate signal) with an acceptable threshold or range. Alternatively, the metric may use other data (e.g., operating frequencies). For example, a system may need to operate at a frequency which is too high for DCC to be performed.

Numerous additional embodiments are also possible. The various embodiments of the invention may provide a number of advantages over conventional systems and methods. For example, some embodiments may be able to operate at substantially higher frequencies than conventional level shifters. Further, some embodiments may be configured to perform DCC on signals which have duty cycles that are outside an acceptable range of values. Still other advantages will be apparent to those of skill in the art of the invention.

BRIEF DESCRIPTION OF THE DRAWINGS

Other objects and advantages of the invention may become apparent upon reading the following detailed description and upon reference to the accompanying drawings.

Figure 1:
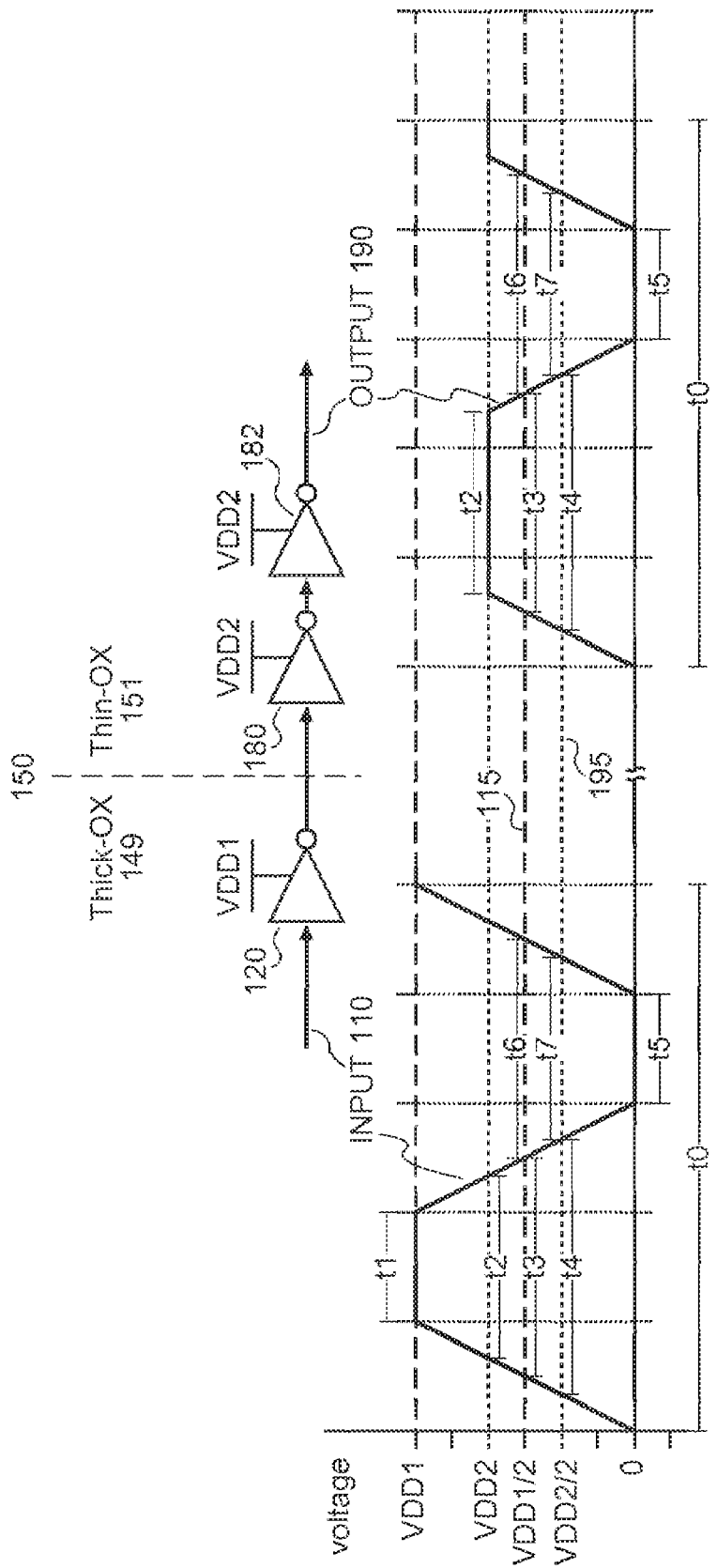
FIG. 1 is a functional block diagram illustrating a simple system for traversing the interface between two different supply voltage domains in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for conveying signals between IC components in domains having different supply voltages, where AC coupling is used to increase the speed at which the common mode voltage of a signal is shifted from one level to another.

In one embodiment, a circuit design includes an AC coupling level shifter connecting two power domains with different supply voltages. The input signal is buffered at the originating supply voltage and the AC component is decoupled from the DC component (the originating common mode voltage). The AC component is then shifted to the level of the destination common mode voltage and buffered at the destination supply voltage. The AC coupling enables the circuit to operate at higher frequencies than are achievable using conventional level shifting circuitry. The circuitry may include duty cycle compensation/correction (DCC). The application of DCC may be alternately enabled and disabled, as desired.

The embodiments of the invention may provide a number of advantages over conventional systems. Primarily, it is contemplated that the present systems and methods will operate at higher frequencies than allowed by the conventional systems being replaced. Also, as noted above, some embodiments of the invention can even correct the duty cycle of the level-shifted signal.

In one embodiment, a circuit design includes an AC coupling level shifter connecting two power domains with different supply voltages and correspondingly different common mode voltages. To allow for duty cycle compensation, the input signal and the inverted input signal are separately processed and are then combined. They are handled in like fashion, simultaneously, through duplicate branches of the circuitry.

The input signal is buffered at the originating domain's supply voltage using an amplifying buffer, ensuring that the signal makes a full excursion across the voltage range (i.e., from 0 to the supply voltage.) Also, the voltage transitions are intentionally delayed for purposes of DCC, as will be explained below. The AC component is then decoupled from the DC component using a capacitor. A common mode (DC) component is then re-introduced into the signal at half the destination domain's supply voltage. The inverted input signal transits the duplicate branch of the circuit, producing an inverted copy of the signal with the same common mode voltage.

Because the level shifting can alter the duty cycle of the signal, the processed signals originating from both the input and the inverted input are combined in a differential amplifier. The combined effect of the delayed signal transitions and the shifted level of the common mode voltage corrects the duty cycle of the signal. The resulting (duty-cycle-corrected) signal is then buffered at the destination domain's supply voltage. The circuitry which performs the duty cycle correction may be selectively disabled to allow the system to operate at higher frequencies.

Before describing the invention in detail, it may be helpful to review conventional level shifting circuitry. FIG. 1 is a diagram of a system of simple buffers. This simple arrangement has been used to connect components in different power domains such as domain 149 and domain 151. Domain 149 and domain 151 are the signal's originating and destination domains, respectively. Input signal 110 has excursions between 0 v (zero volts) and VDD1 (the supply voltage of the originating domain) centered about the common mode voltage of VDD1/2 (115). The signal passes through inverter 120 at the originating domain supply voltage VDD1, then into inverters 180 and 182 at the destination supply voltage VDD2. In this example, VDD1 is greater than VDD2. The output of inverter 182 is truncated (with respect to the input) so that the signal now has excursions from 0 to VDD2.

This arrangement causes the duty cycle to change. A comparison of the input and output signals in FIG. 1 reveals the change in duty cycle. The duty cycle is essentially the percentage of the time that the signal is high (i.e., above the common mode voltage.) More particularly, the duty cycle is the area above the common mode voltage as a percentage of the total area, where the area is defined as the region(s) bounded by the signal and the common mode voltage.

Input signal 110 has a duty cycle of 50%. The minimum voltage is 0 and the maximum voltage is VDD1. Interval t1 is equal to interval t5, interval t3 is equal to interval t6, and the excursions from the common mode voltage of VDD1/2 are equal (VDD1/2). Output signal 190 is a truncation of input signal 110. Because output signal 190 can only have values between 0 and VDD2, the portion of the signal above VDD2 is effectively truncated.

Considering output signal 190, the minimum voltage is 0, the maximum is VDD2, and the excursions from the common mode voltage of VDD2/2 are equal (VDD2/2). Interval t2 is greater than interval t5, interval t4 is greater than interval t7. Output signal 190 therefore has a duty cycle of greater than 50%.

Figure 2:
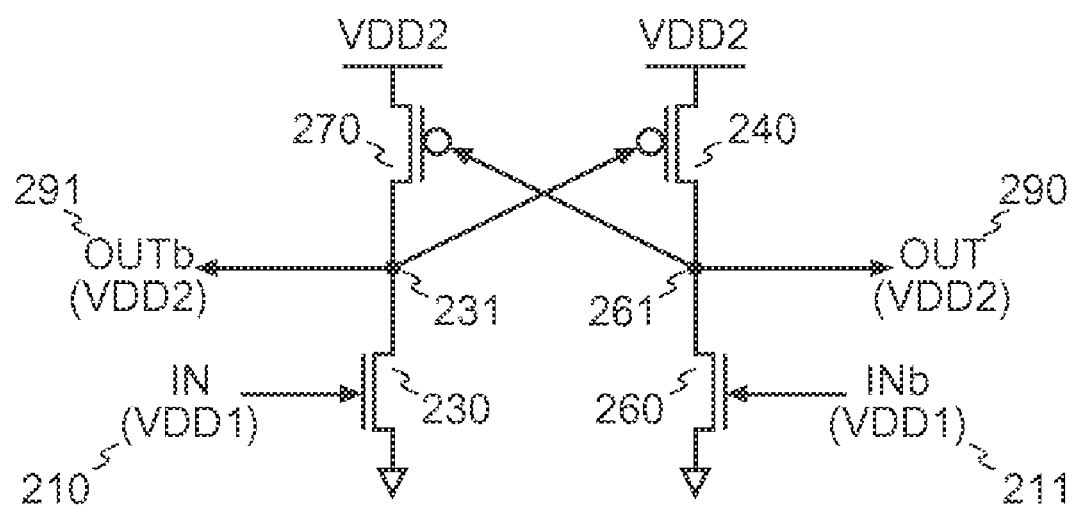
FIG. 2 is a functional block diagram illustrating a typical level shifter in accordance with the prior art.

To avoid the duty cycle errors (the change from 50% to greater than 50%) created by the arrangement just described, level shifters are used. FIG. 2 is a diagram of a typical level shifter.

The level shifter of FIG. 2 is implemented using two NMOS and two PMOS transistors. Each NMOS/PMOS transistor pair (consisting of one NMOS and one PMOS transistor) is connected in series with a supply voltage of VDD2 and ground. The level shifter inputs are an input signal (210) and an inverted input signal (211) connected to NMOS transistors 230 and 260, respectively. The NMOS/PMOS transistor pairs are cross-coupled from nodes 231 and 261 to PMOS transistor inputs 240 and 270, respectively. The output (and inverted output) is provided at node 231 (and 261).

In the level shifter of FIG. 2, when input 210 is VDD1 (high), transistor 230 shorts to ground, and transistor 240 shorts to VDD2. The result is that output 290 is VDD2 (high). Since input 210 is high, inverted input 211 would be 0 (low), transistor 260 would be open, and PMOS transistor 270's input from node 261 would be VDD2 (high). Since transistor 240 is shorted to VDD2, transistor 270 would be closed, and output 291 would be 0 (low) since transistor 230 is shorted to ground. Conversely, when input 210 is 0 (low) and inverted input 211 is VDD1 (high), output 290 is 0 (low) and output 291 is VDD2 (high).

Generally, the conventional circuit of FIG. 2 cannot be used at high frequencies, such as in systems operating at over 1 GHz. An embodiment of an AC coupling level shifter that can be used for high speed operations will now be described.

Figure 3:
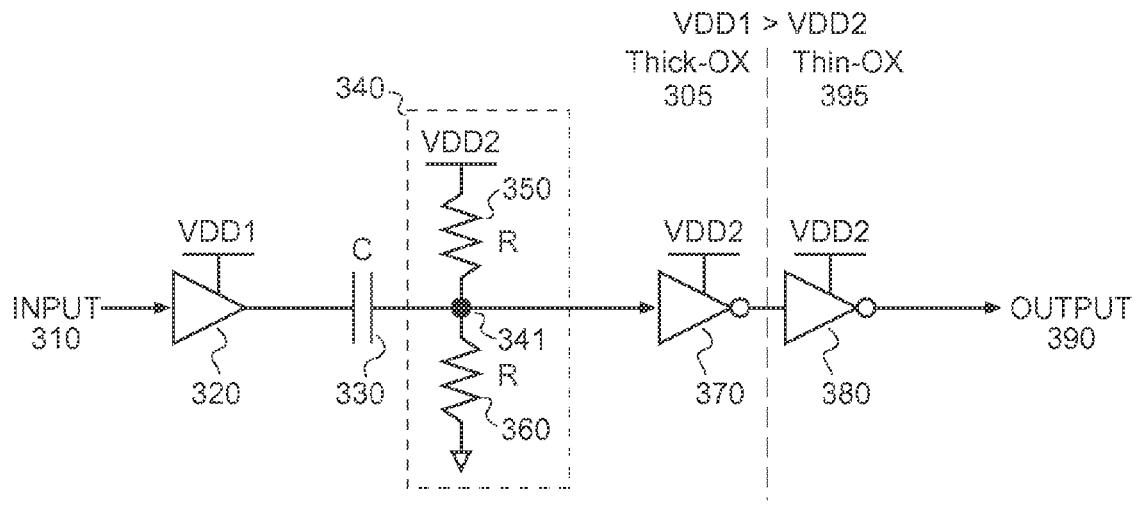
FIG. 3 is a functional block diagram illustrating a simple level shifting system in accordance with one embodiment.
Figure 4:
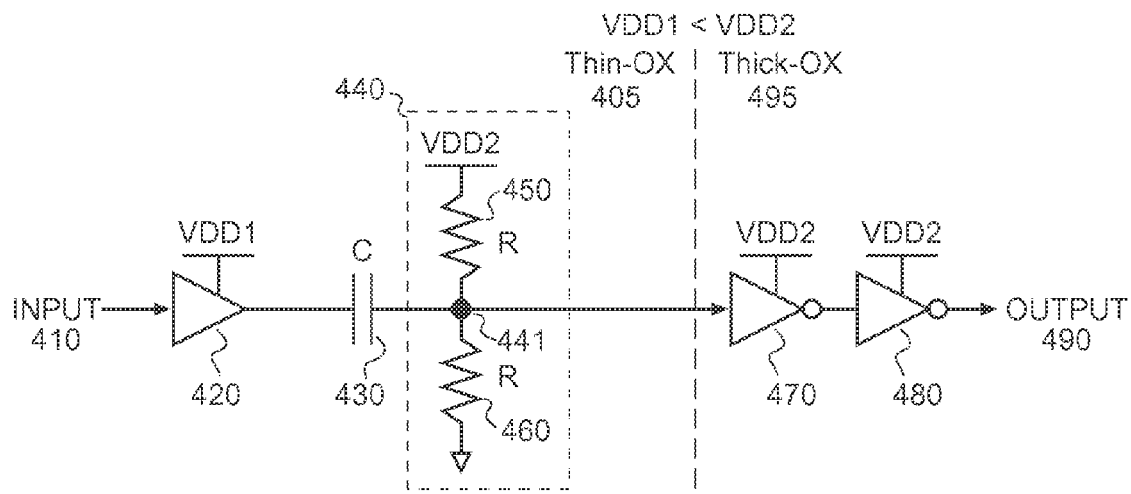
FIG. 4 is a functional block diagram illustrating a simple level shifting system in accordance with another embodiment.

Illustrated in FIG. 3 and FIG. 4 are AC coupling level shifters for high speed operation. Both level shifters are similarly constructed. The components of the level shifter of FIG. 3 include buffer 320, capacitor 330, voltage divider 340, and inverters 370 and 380. The components are connected in series. Voltage divider 340 includes resistors 350 and 360 connected in series between a supply voltage and ground, with an intermediate node 341 between the resistors. There are two power domains: a higher-voltage domain and a lower-voltage domain. The higher-voltage domain may, for example, be associated with analog circuitry, while the lower-voltage domain may be associated with digital circuitry. Typically, the higher-voltage domain will be implemented with a thicker oxide layer, and the lower-voltage domain will be implemented with a thinner oxide layer.

Similarly, the components of the level shifter of FIG. 4 include buffer 420, capacitor 430, voltage divider 440, and inverters 470 and 480, connected in series. Voltage divider 340 also includes two resistors (350 and 360) connected in series between a supply voltage and ground, with an intermediate node (441) between the resistors. Again, one of the power domains is implemented with a thicker oxide layer while the other is implemented with a thinner oxide layer.

It should be noted that the power domains are reversed in the two figures. In FIG. 3, the originating domain (305) is the higher-voltage domain (with supply voltages VDD1>VDD2). In FIG. 4, the originating domain (405) is the lower-voltage domain (with supply voltages VDD1<VDD2). In FIG. 3, components 320, 330, 340, and 370 are in the originating, higher-voltage domain 305, and component 380 is in the destination, lower-voltage domain 395. In FIG. 4, components 420, 430, and 440 are in the originating, lower-voltage domain 405, and components 470 and 480 are in the destination, higher-voltage domain 495.

FIG. 4 has essentially the same structure as FIG. 3. In the following description of FIG. 3, the corresponding components of FIG. 4 are noted in parentheses.

Input 310(410) is connected to the input of buffer 320 (420), which has a supply voltage VDD1. The output of buffer 320(420) is connected to the input of inverter 370(470) by capacitor 330(430). The capacitor provides AC coupling, decoupling the DC component of the input and passing the AC component. Resistor 350(450) of voltage divider 340 (440) is connected to supply voltage VDD2 and resistor 360 (460) of voltage divider 340(440) is connected to ground. Intermediate node 341(441) is held at a voltage of VDD2/2. The two resistors are connected to each other and the rest of the circuit at intermediate node 341(441). Inverters 370(470) and 380(480) are serially connected, and the output of inverter 380(480) is output signal 390(490).

Input signal 310(410) has excursions between 0 v (zero volts) and VDD1 (the supply voltage of the originating domain.) Input signal 310(410) is centered about the common mode voltage VDD1/2. Output signal 390(490) has excursions between 0 v (zero volts) and VDD2 (the supply voltage of the destination domain). By using AC coupling and voltage divider 340(440), the common mode voltage of the signal at intermediate node 341(441) is shifted to VDD2/2. This signal is input to inverter 370(470). Output 390(490) of inverter 380(480) has a duty cycle which is nearly the same as that of input 310's(410's) duty cycle, regardless of the VDD1-VDD2 voltage difference.

Figure 5:
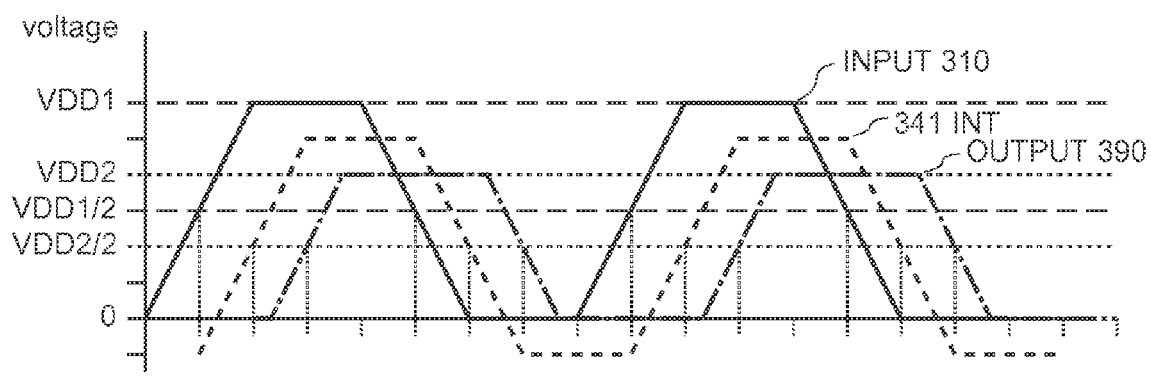
FIG. 5 is an illustration of level shifting with a change in duty cycle in accordance with one embodiment.

In FIG. 5, three waveforms are illustrated: an input signal; an intermediate signal; and an output signal. In this example, VDD1 is greater than VDD2, as in FIG. 3. Input 310 has excursions between 0 v (zero volts) and supply voltage VDD1, and has a common mode voltage of VDD1/2. As illustrated, the duty cycle is 50%. Intermediate signal 541 (at intermediate node 341) has the same AC excursions as input 310, but with a common mode voltage of VDD2/2, as set by voltage divider 340. The duty cycle of intermediate signal 541 is 50%. Output signal 390 has the same common mode voltage as intermediate signal 541, but with excursions between 0 v (zero volts) and supply voltage VDD2, as set by inverters 370 and 380. The duty cycle of output signal 390 is 50%.

Figure 6:
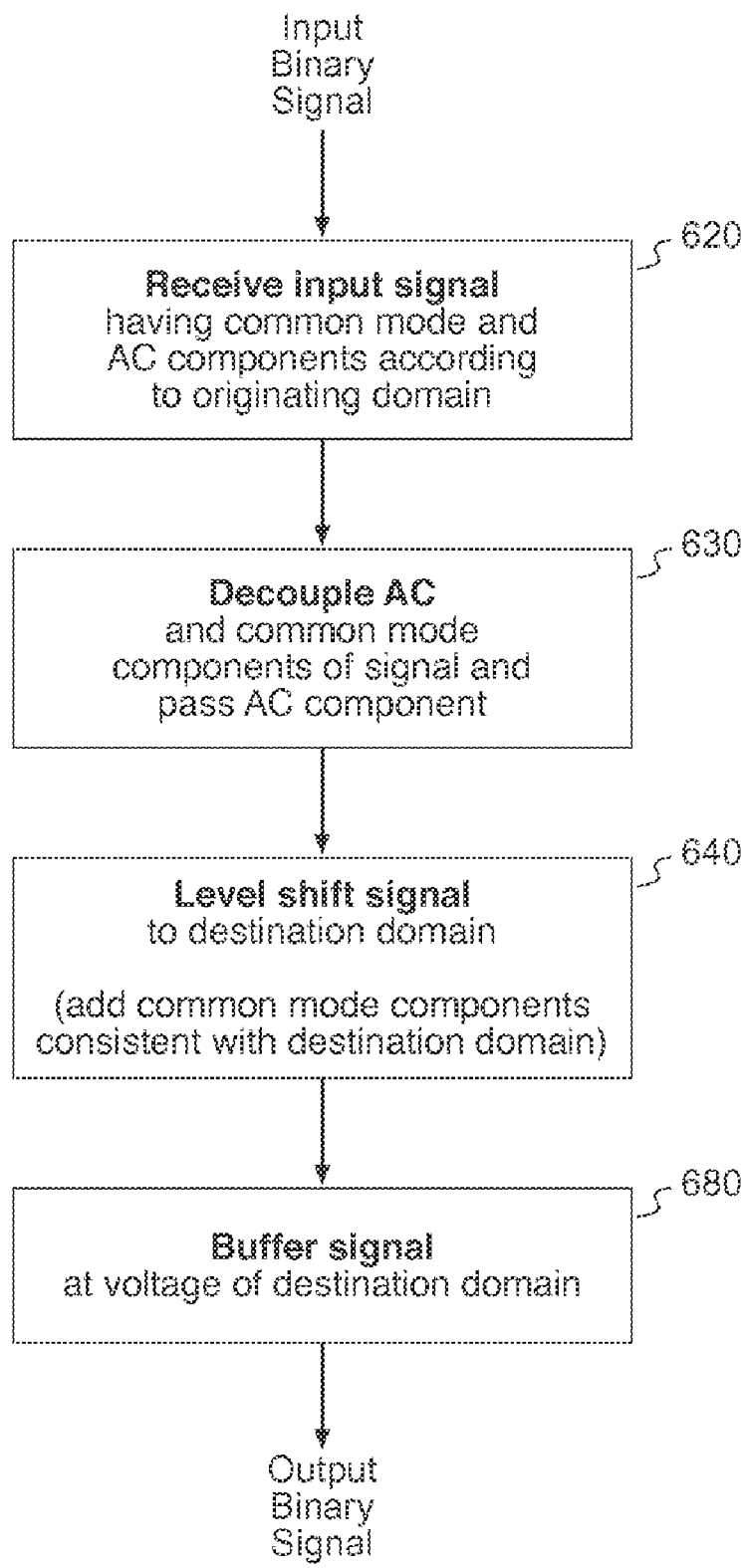
FIG. 6 is a flowchart illustrating a method in accordance with one embodiment.

The basic operation of the embodiments described in connection with FIGS. 3-5 can be summarized as shown in FIG. 6. FIG. 6 is a flowchart of a level shifting method in accordance with one embodiment. As shown in this figure, the input binary signal of an originating domain (having AC and common mode components according to the originating domain's supply voltage) is received (block 620). The AC component of the signal is decoupled from the originating common mode voltage (block 630). The AC component is then shifted to the level of the destination domain's common mode voltage (block 640) and buffered at the destination supply voltage (block 680). The output binary signal is then available in the destination domain.

Figure 7:
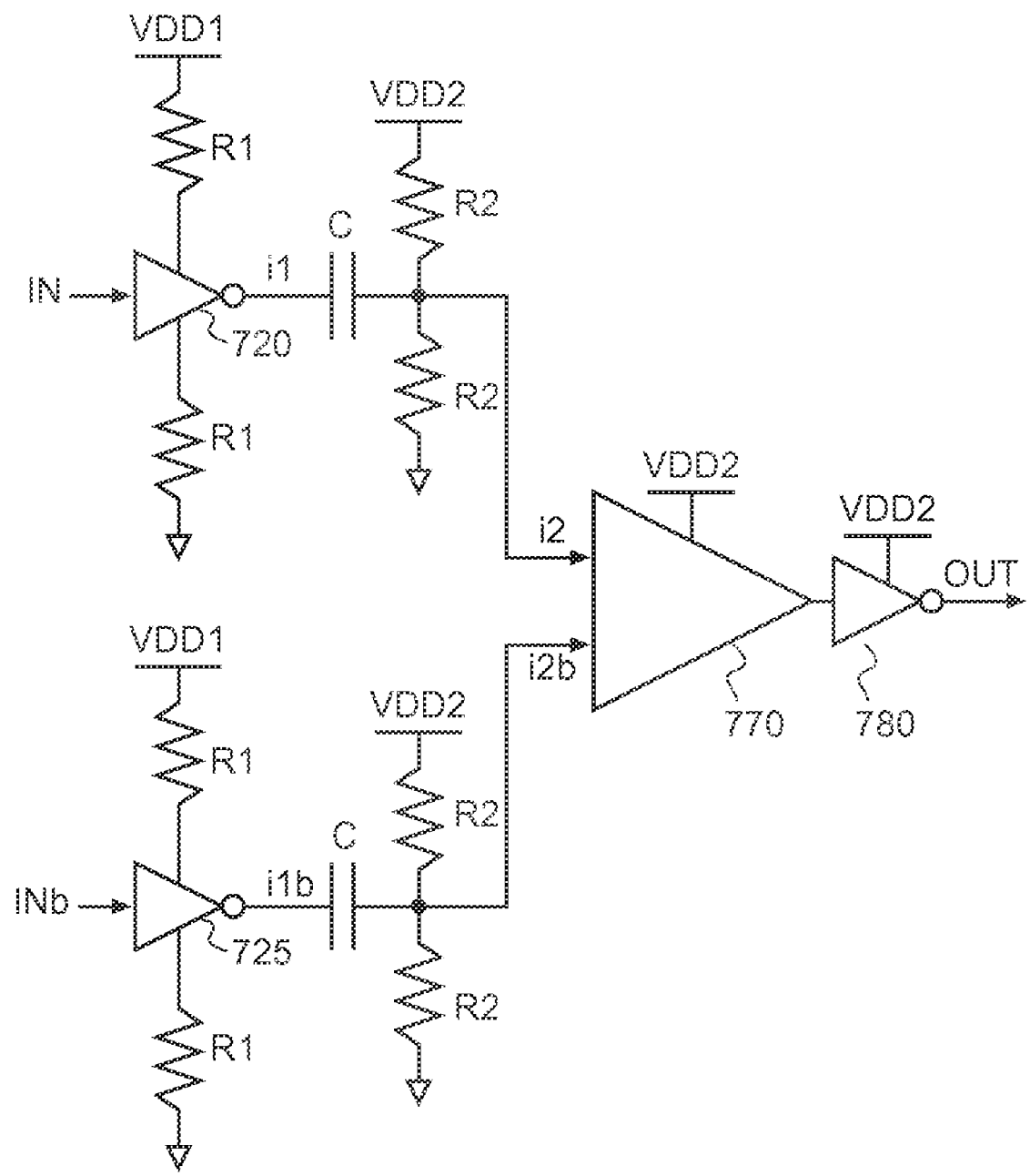
FIG. 7 is a functional block diagram illustrating a level shifting system with duty cycle compensation in accordance with one embodiment.
Figure 8:
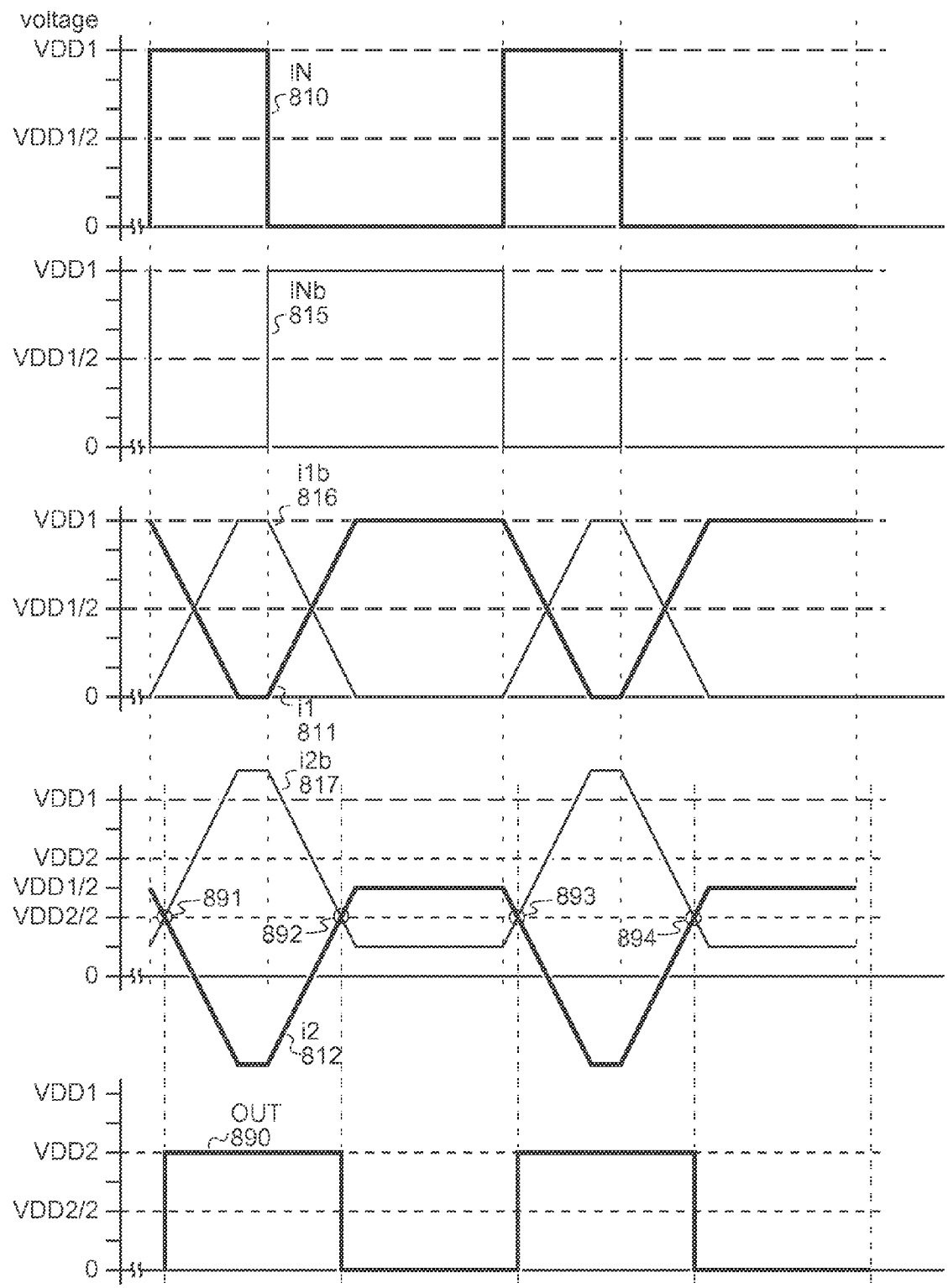
FIG. 8 is an illustration of level shifting with duty cycle compensation in accordance with one embodiment.

The embodiments of FIG. 3 and FIG. 4 can operate at very high frequencies and do not have a supply voltage dependency, but cannot correct for duty cycle errors in the input signal. FIG. 7 illustrates an AC coupling level shifter with the addition of duty cycle compensation/correction (DCC) in accordance with one embodiment. A combination of two processed signals is used to determine the output signal. FIG. 8 illustrates exemplary signals (waveforms) as might be associated with an embodiment such as that illustrated in FIG. 7.

The circuit of FIG. 7 has two upstream branches. The branches are of the same design, but the input signal of each is the inverted signal of the other. Input signal 810 and inverted input signal 815 are separately processed through the duplicate branches. They are then combined and inverted to complete the DCC.

The first of the branches in FIG. 7 includes inverter 720, capacitor 730, and voltage divider 740 connected in series. Similarly, the second branch includes inverter 725, capacitor 735, and voltage divider 745 connected in series. Each branch is connected to one of the inputs of differential amplifier 770, the output of which is connected to inverter 780.

The functioning of the circuit will be explained with the aid of exemplary waveforms illustrated in FIG. 8. In this example, the supply voltage VDD1 of the originating power domain is greater than the supply voltage VDD2 of the destination power domain. Input signal 810 has excursions from 0 v (zero volts) to VDD1 and has a duty cycle of less than fifty percent. Note that the waveform is substantially square and the signal is high approximately one third of the time. Signal INb (815) is the inverse of signal IN (810).

Inverters 720 and 725 include resistors to modify the voltage transitions between zero and VDD1. The nearly instantaneous voltage changes seen in the square waveforms of inputs IN (810) and INb (815) are greatly extended in time by inverters 720 and 725, as shown in the waveforms of signals i1 (811) and i1b (816), respectively. This is a result of adding resistors between inverters 720/725 and VDD1/ground, thereby reducing the current flowing through the inverters. Capacitors 730 and 735 provide AC coupling. Voltage dividers 740 and 745 shift the signals received from the capacitors to provide a common mode voltage of VDD2/2. The shift can be seen in the waveforms of signals i2 (812) and i2b (817).

Differential amplifier 770 takes signals i2 (812) and i2b (817) as inputs. In taking the difference of its inputs, differential amplifier 770 effectively amplifies the signal and modifies the timing of the voltage transitions. Note the waveform crossings (intersections) 891, 892, 893, and 894 of signals i2 (812) and i2b (817). At these points, the difference between the signals is zero. Between intersections 891 and 892, the difference is less than zero. Between intersections 892 and 893, the difference is greater than zero. The amplified differential voltage is then inverted by inverter 780. Inverter 780 buffers the output of differential amplifier 770, producing a signal that is truncated to the operating voltage range of the destination domain (i.e., the signal is limited to excursions from zero to VDD2). The result is output signal OUT (890), a substantially square waveform with excursions from 0 v (zero volts) to VDD2 and a duty cycle of approximately fifty percent.

The circuit of FIG. 7 can operate at higher rates than the conventional circuit of FIG. 2, but it cannot operate at as high a rate as the circuit of FIG. 3. This is the result of the amplification of the signals within the DCC circuitry. The AC coupling Level Shifter embodiment of FIG. 9 adds switching circuitry 901 to the circuitry of FIG. 7, allowing the DCC function to be switched on and off.

Switching circuitry 901 includes two NMOS and two PMOS switching transistors which are used to modify the behavior of inverters 710 and 715. Each switching transistor is connected to a point between an inverter and one of the inverter's attached resistors. PMOS transistor 923 couples supply VDD1 to inverter 720 and NMOS transistor 924 couples inverter 720 to ground. PMOS 928 couples supply VDD1 to inverter 725, while NMOS transistor 929 couples inverter 725 to ground.

The switching transistor inputs are coupled to switching signal EN. Signal EN is directly coupled to NMOS switching transistors 924 and 929, and via inverter 919 to PMOS switching transistors 923 and 928. When EN=0, all four transistors act as open switches so that inverters 720 and 725 are coupled to VDD1 and ground through resistors 921, 922, 926 and 927. When EN=1, all four transistors act as closed switches, effectively bypassing resistors 921, 922, 926 and 927 and coupling inverters 720 and 725 essentially directly to VDD1 and ground.

When DCC is enabled (EN=0), the circuit operates as an AC Coupled Level Shifter with DCC (a lower speed operation) similar to FIG. 7. When DCC is disabled (EN=1), the circuit operates as an AC Coupled Level Shifter without DCC (a higher speed operation). That is, when the switching circuitry is "active", each NMOS-PMOS transistor pair of the switching circuitry shunts their respective/connected inverter directly to the supply voltage and ground, thereby disabling DCC. Otherwise, when the switching circuitry is "inactive", the circuit of FIG. 9 functions as explained above in the discussion of the circuitry of FIG. 7.

Figure 9:
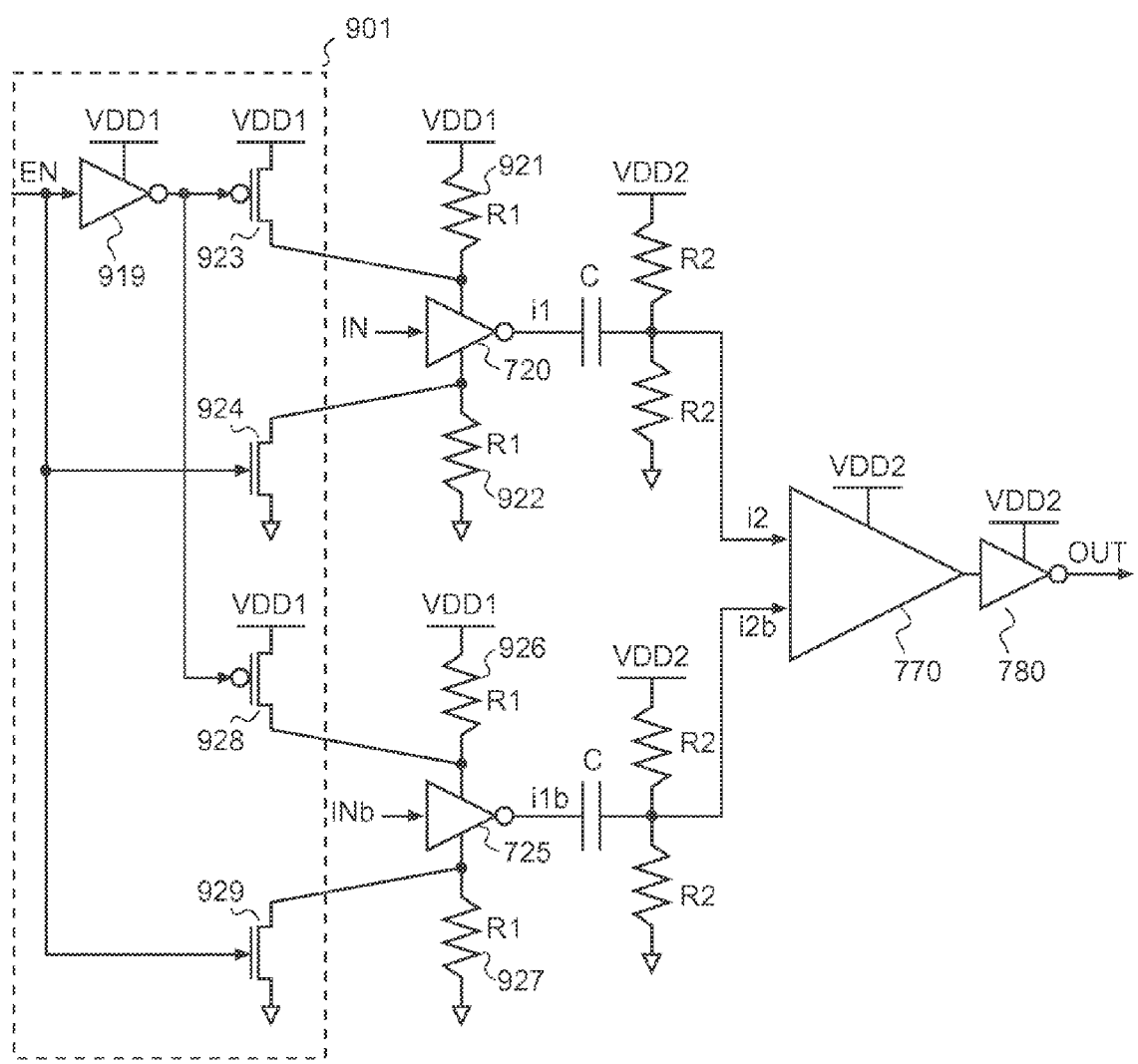
FIG. 9 is a functional block diagram illustrating a level shifting system incorporating duty cycle compensation switching circuitry in accordance with one embodiment.
Figure 11:
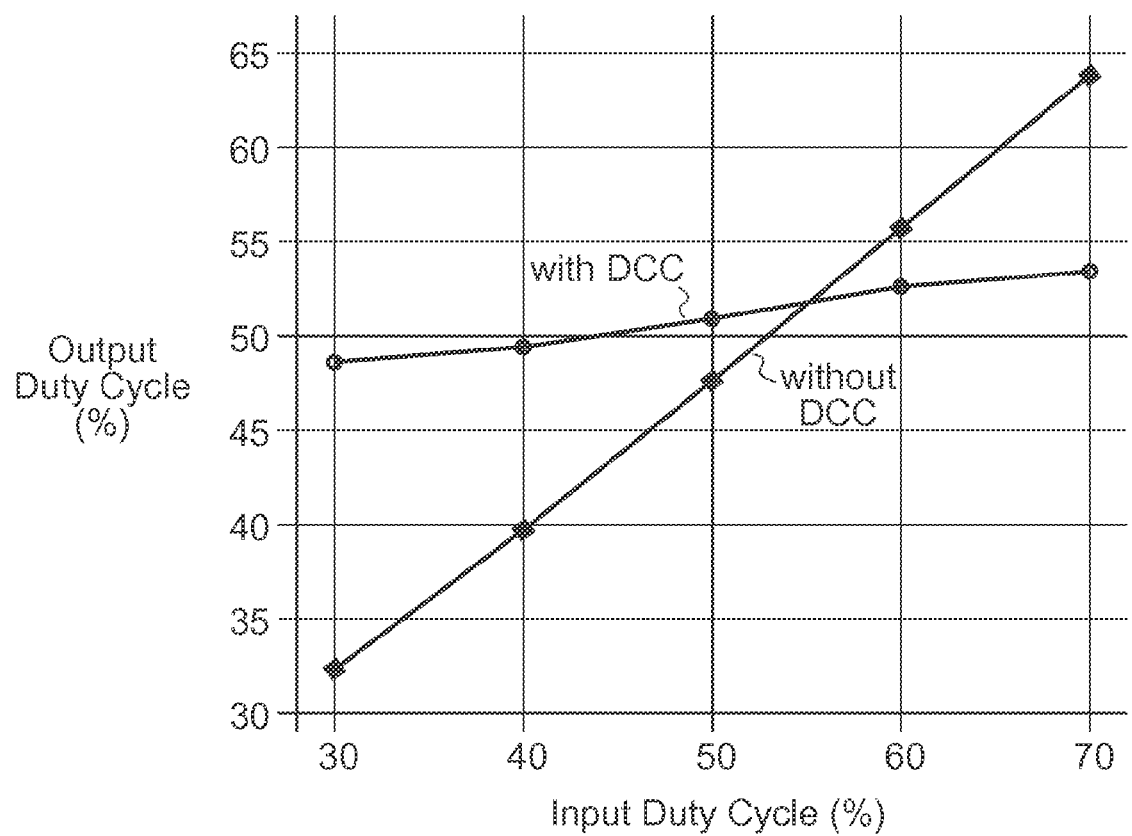
FIG. 11 is an illustration of the effects of duty cycle compensation in level shifters in accordance with one embodiment.

FIG. 11 shows the results of a simulation of the embodiment illustrated in FIG. 9. A system frequency of 5 Ghz was used. The supply voltages were set at VDD1=1.5v and VDD2=1.0v. The results are both tabulated and plotted in FIG. 11. The duty cycles of the input signals were varied from 30% to 70%. Without DCC, the duty cycles of the resulting output signals were slightly improved, varying between 32% and 64%. With DCC enabled, the resulting duty cycles of the output signals were significantly improved, ranging from 45% to 50%.

Figure 10:
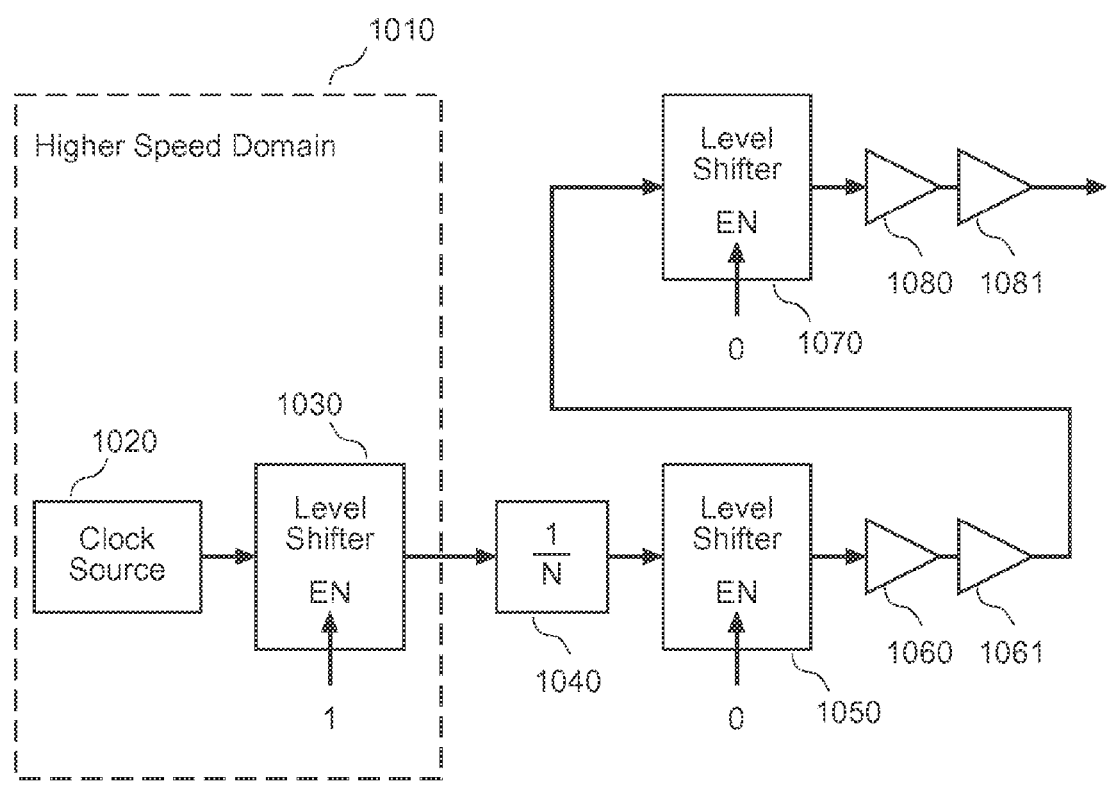
FIG. 10 is a functional block diagram illustrating a clock tree using level shifting in accordance with one embodiment.

The circuit of FIG. 9 can be used, for example, as a clock buffer to correct duty cycle errors within a clock tree. FIG. 10 illustrates such a system. Consider a clock tree driven by clock source 1020 (e.g., a voltage controlled oscillator) operating at a first clock rate. Some portions of an integrated circuit supplied by the clock tree may use the clock signal at the first clock rate, while other portions of the integrated circuit operate at a reduced clock rate. Clock divider 1040 reduces the clock rate by a factor of N to supply the reduced-rate clock signal.

Duty cycle errors may be introduced at various points in a clock tree. For example, the duty cycle may be affected by amplification through inverters 1060, 1061, 1080 and 1081. The AC coupled level shifter of FIG. 9 (with switching circuitry) appears three times in this example: level shifters 1030, 1050, and 1070. Upstream of clock divider 1040, level shifter 1030 must be able to operate at the higher clock rate. Disabling the DCC circuitry of level shifter 1030 enables it to operate at this high clock rate. Downstream of clock divider 1040, the clock frequency is low enough to apply corrections to the clock signal. The DCC circuitry of level shifters 1050 and 1070 is therefore enabled, allowing correction of the clock signal's duty cycle. Thus, the DCC is not enabled (EN=1) within the higher-speed domain 1010 for level shifter 1030, but is enabled (EN=0) within the lower-speed domain for level shifters 1050 and 1070. The DCC can therefore correct for duty cycle errors that would otherwise accumulate and interfere with the integrated circuit's operations.

While the foregoing description presents several specific exemplary embodiments, there may be many variations of the described features and components in alternative embodiments. For example, the switching circuitry may be implemented in various ways. In one embodiment, the DCC switching circuitry can use a single type of transistor instead of both NMOS and PMOS transistors. In another embodiment, the switching circuitry is coupled to a DCC decision unit that selectively enables and disables the DCC circuitry. The DCC decision unit can use any of various measurements or estimations for its evaluation (i.e., input signal, intermediate signal, output signal, clock frequency, etc.). For example, the evaluation can be based on a comparison of input duty cycle with a threshold. Alternative embodiments may implement duty cycle compensation using criteria different than those % used above. The pairs of resistors connected to the inverters in the above descriptions are equal and fixed but need not be. In yet another embodiment, a differential amplifier can be used to perform the AC coupling. Many other variations will also be apparent to persons of skill in the art of the invention upon reading the present disclosure.

Those of skill in the art will understand that information and signals may be represented using any of a variety of different technologies and techniques. For example, data, information, signals, etc. that may be referenced throughout the above description may be represented by voltages, currents, and the like. The information and signals may be communicated between components of the disclosed systems using any suitable transport media, including wires, metallic traces, vias, and the like.

The various illustrative logical blocks, modules, and circuits described in connection with the embodiments disclosed herein may be implemented or performed with application specific integrated circuits (ASICs,) field programmable gate arrays (FPGAs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A method for level shifting a binary signal comprising:
   receiving an input binary signal having
      an AC component and
      a first common mode component at a first voltage;
   decoupling the AC component from the first common mode component;
   adding a second common mode component at a second voltage to the AC component;
   providing a binary output signal having
      the AC component and
      the second common mode component at the second voltage; and
   alternately operating in either a first mode or a second mode, wherein in the first mode duty cycle compensation (DCC) is performed on the binary output signal, and in the second mode DCC is not performed on the binary output signal.

2. The method of claim 1, further comprising:
   operating in the first operating mode when the duty cycle of the input binary signal is outside an acceptable range.

3. The method of claim 1, wherein the first voltage is greater than the second voltage.

4. The method of claim 1, wherein the second voltage is greater than the first voltage.

5. A level shifter system comprising
   a capacitor configured to receive a binary input signal, to decouple AC and DC components of the binary input signal, and to pass the AC component to an intermediate node;
   a voltage divider having first and second resistors connected in series between a supply voltage and ground, wherein the intermediate node is located between the first and second resistors; and
   Duty Cycle Compensation (DCC) circuitry that includes
      a first branch comprising the voltage divider, the capacitor, and an inverter;
         wherein the inverter is coupled to third and fourth resistors and
         wherein the third resistor is coupled between the inverter and the supply voltage and the fourth resistor is coupled between the inverter and ground;
      a second branch of the same construction as the first branch;
      wherein both branches are coupled to the inputs of a differential amplifier;
      wherein the first branch is coupled to receive the input signal, the second branch is coupled to receive the inverted input signal, and the differential amplifier output is coupled to an amplifier.

6. The system of claim 5, further comprising:
   switching circuitry configured to selectively enable and disable the DCC.

7. The system of claim 6
   wherein the switching circuitry comprises four transistors configured to be either all open or to be all closed; and
   wherein each transistor selectively shunts one of the resistors that is connected to one of the inverters.

8. The system of claim 6, further comprising:
   a DCC decision unit, wherein the DCC decision unit is configured to evaluate a metric and dispatch control signals to the switching circuitry.

9. The system of claim 8, wherein the metric is a comparison of a duty cycle value to an acceptable range or threshold.

10. The system of claim 9, wherein the duty cycle is the input signal duty cycle.

11. A level shifter and Duty Cycle Compensation (DCC) system comprising:
   first and second branches,
   wherein each of the first and second branches includes
      an inverter coupled to two resistors, wherein the first resistor is coupled between the inverter and a voltage supply and the second resistor is coupled between the inverter and ground, wherein the inverter is configured to receive a corresponding input signal and top produce a corresponding intermediate signal;
      a capacitor configured to receive the corresponding intermediate signal, to decouple AC and DC components of the corresponding intermediate signal, and to pass the AC component of the corresponding intermediate signal to an intermediate node;
      a voltage divider having two resistors connected in series between the supply voltage and ground, wherein the intermediate node is located between the two resistors; and
   wherein the intermediate node of each branch is coupled to a corresponding input of a differential amplifier;
   wherein the first branch is coupled to receive an first input signal, the second branch is coupled to receive the inverted first input signal, and an output of the differential amplifier is coupled to an amplifier.

* * * * *